(12) United States Patent
Yamao

(10) Patent No.: US 10,516,374 B2
(45) Date of Patent: Dec. 24, 2019

(54) CLASS-D AMPLIFIER AND AUDIO PLAYBACK APPARATUS

(71) Applicant: Panasonic Intellectual Property Management Co., Ltd., Osaka (JP)

(72) Inventor: Takashi Yamao, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 7 days.

(21) Appl. No.: 16/075,307

(22) PCT Filed: Sep. 26, 2016

(86) PCT No.: PCT/JP2016/004334
§ 371 (c)(1),
(2) Date: Aug. 3, 2018

(87) PCT Pub. No.: WO2017/154051
PCT Pub. Date: Sep. 14, 2017

(65) Prior Publication Data
US 2019/0044487 A1 Feb. 7, 2019

(30) Foreign Application Priority Data
Mar. 8, 2016 (JP) .................. 2016-045027

(51) Int. Cl.
*H03F 3/217* (2006.01)
*H03F 1/30* (2006.01)
*H03F 3/187* (2006.01)

(52) U.S. Cl.
CPC .......... *H03F 3/2173* (2013.01); *H03F 1/303* (2013.01); *H03F 1/308* (2013.01); *H03F 3/187* (2013.01);
(Continued)

(58) Field of Classification Search
CPC ........ H03F 3/2173; H03F 3/187; H03F 1/308; H03F 1/303; H03F 2200/351;
(Continued)

(56) References Cited

U.S. PATENT DOCUMENTS 6,304,137 B1 10/2001 Pullen et al.
8,760,230 B2 * 6/2014 Hsieh .................... H03F 3/2171
330/10
(Continued)

FOREIGN PATENT DOCUMENTS

JP 7-254824 10/1995
JP 2004-146868 5/2004
(Continued)

OTHER PUBLICATIONS

The Extended European Search Report dated Jan. 29, 2019 for the related European Patent Application No. 16893383.6.
(Continued)

*Primary Examiner* — Khanh V Nguyen
(74) *Attorney, Agent, or Firm* — McDermott Will & Emery LLP

(57) ABSTRACT

A class-D amplifier that amplifies an input audio signal includes: a push-pull circuit that has at least two switching transistors; an electric current suppressor that is disposed between the push-pull circuit and a power source that supplies electric power to the push-pull circuit; a switch that is connected in parallel with the electric current suppressor; a determiner that determines whether or not the class-D amplifier is in a state where sound is not emitted; and a controller. When the determiner determines that the class-D amplifier is in a state where sound is not emitted, the controller turns off the switch such that a path for electric current flowing from the power source to the push-pull circuit runs through the electric current suppressor. When
(Continued)

the determiner determines that the class-D amplifier is in a state where sound is emitted, the controller turns on the switch such that the path for electric current bypasses the electric current suppressor.

5 Claims, 4 Drawing Sheets

(52) U.S. Cl.
CPC .... *H03F 2200/03* (2013.01); *H03F 2200/351* (2013.01)

(58) Field of Classification Search
CPC .... H03F 2200/03; H03F 3/265; H03F 3/2175; H03F 3/2171; H03F 3/183; H03F 1/52; H03F 1/0211; H03F 3/217
USPC .............................. 330/10, 251, 207 A, 297
See application file for complete search history.

(56) References Cited

U.S. PATENT DOCUMENTS

| | | | |
|---|---|---|---|
| 10,105,173 B2 * | 10/2018 | Ma | A61B 18/1206 |
| 2007/0164814 A1 * | 7/2007 | Wendt | H03F 1/0227 |
| | | | 330/10 |
| 2012/0099743 A1 * | 4/2012 | Ozaki | H03F 1/0205 |
| | | | 381/120 |

FOREIGN PATENT DOCUMENTS

| | | |
|---|---|---|
| JP | 2005-276494 | 10/2005 |
| JP | 2007-088926 | 4/2007 |

OTHER PUBLICATIONS

International Search Report of PCT application No. PCT/JP2016/004334 dated Dec. 13, 2016.

* cited by examiner

CLASS-D AMPLIFIER AND AUDIO PLAYBACK APPARATUS

This application is a U.S. national stage application of the PCT International Application No. PCT/JP2016/004334 filed on Sep. 26, 2016, which claims the benefit of foreign priority of Japanese patent application No. 2016-045027 filed on Mar. 8, 2016, the contents all of which are incorporated herein by reference.

TECHNICAL FIELD

The present disclosure relates to a class-D amplifier and an audio playback apparatus.

BACKGROUND ART

In a Class-D amplifier including two switching transistors to constitute a push-pull circuit, shoot-through current is generated when the two switching transistors simultaneously turn into a conduction state (hereinafter, a conduction state is referred to as "on" and a non-conduction state is referred to as "off"). The class-D amplifier is supplied with a time span during which the two switching transistors are not simultaneously turned on (hereinafter referred to as a "dead time") within a switching period of the two transistors (one switching from on to off and the other switching from off to on) to suppress generation of shoot-through current.

Meanwhile, in the class-D amplifier, there is a possibility that a distortion due to the dead time occurs and sound quality is deteriorated when audio signal is amplified. Thus, it is preferable that the dead time be set as short as possible. However, in many cases, the generation of a distortion does not cause any problem while no sound is emitted from a loudspeaker connected to the class-D amplifier owing to no audio signal to be amplified or because of the mute setting of sound emitted from an audio playback apparatus equipped with the class-D amplifier, for example.

There is a presented class-D amplifier in which dead time is extended relatively to suppress shoot-through current while no sound is emitted from the loudspeaker. Specifically, the class-D amplifier increases the capacity of capacitor (or the number of capacitors) used in a resistor-capacitor (RC) circuit included in a dead time generator for generating the dead time by switch operation, and increases the time constant, thereby the dead time is extended while no sound is emitted from the loudspeaker. PTL 1 discloses an art related to these class-D amplifiers.

CITATION LIST

Patent Literature

PTL 1: Unexamined Japanese Patent Publication No. 2007-88926

SUMMARY

The class-D amplifier described above can switch between dead time lengths set for respective states with and without sound emitted from the loudspeaker. However, switching between the dead time lengths in a short period of time is difficult because of time taken for charging and discharging the capacitors during the switching transition. For example, in a class-D amplifier which is in a state where sound is not emitted from a loudspeaker and the dead time is extended, it is desirable that the dead time shortens instantaneously when sound is emitted from the loudspeaker. However, it is difficult in the class-D amplifier described above to shorten the dead time instantaneously because discharging the capacitors takes time. Thus, in the class-D amplifier described above, there is a possibility that a distortion due to the dead time occurs and sound quality is deteriorated, during a period of shortening the dead time. In this way, in the class-D amplifier described above, there is a possibility that a sound quality is deteriorated because of the configuration for suppressing shoot-through current at the time of no sound being emitted from the loudspeaker.

The present disclosure provides a class-D amplifier and an audio playback apparatus that suppress shoot-through current at the time of no sound being emitted from a loudspeaker while reducing sound quality deterioration.

A class-D amplifier according to the present disclosure is a class-D amplifier that amplifies an input audio signal. The class-D amplifier includes: a push-pull circuit that has at least two switching transistors; an electric current suppressor that is disposed between the push-pull circuit and a power source that supplies electric power to the push-pull circuit; a switch that is connected in parallel with the electric current suppressor; a determiner that determines whether or not the class-D amplifier is in a state where sound is not emitted; and a controller. When the determiner determines that the class-D amplifier is in a state where sound is not emitted, the controller turns off the switch such that a path for electric current flowing from the power source to the push-pull circuit runs through the electric current suppressor. When the determiner determines that the class-D amplifier is in a state where sound is emitted, the controller turns on the switch such that the path for electric current bypasses the electric current suppressor.

An audio playback apparatus according to the present disclosure includes the class-D amplifier according to the present disclosure, a loudspeaker that converts an amplified signal output from the class-D amplifier to sound, and an adjuster that adjusts volume of sound emitted from the loudspeaker. States in which sound is not emitted include a state in which the volume of sound is adjusted to substantially zero by the adjuster.

The class-D amplifier and the audio playback apparatus according to the present disclosure suppress shoot-through current at the time of no sound being emitted from a loudspeaker while reducing sound quality deterioration.

DESCRIPTION OF EMBODIMENTS

Hereinafter, exemplary embodiments will be described in detail with reference to the drawings as appropriate. However, detailed descriptions that are more than necessary may be omitted. For example, a detailed description of a matter that has been already well-known, and an overlapped description for a substantially identical configuration may be omitted. This is intended to avoid unnecessary redundancy of the following description and to facilitate understanding by those skilled in the art.

Note that the attached drawings and the following description are provided for those skilled in the art to fully understand the present disclosure, and are not intended to limit the subject matter as described in the appended claims.

Further, the respective drawings are schematic views, and are not always exactly shown. Further, in the respective drawings, substantially identical components are denoted by identical reference marks, and descriptions of those components may be omitted or simplified.

First Exemplary Embodiment

A first exemplary embodiment will now be described with reference to FIGS. 1 to 4.

[1-1. Configuration]

Figure 1:
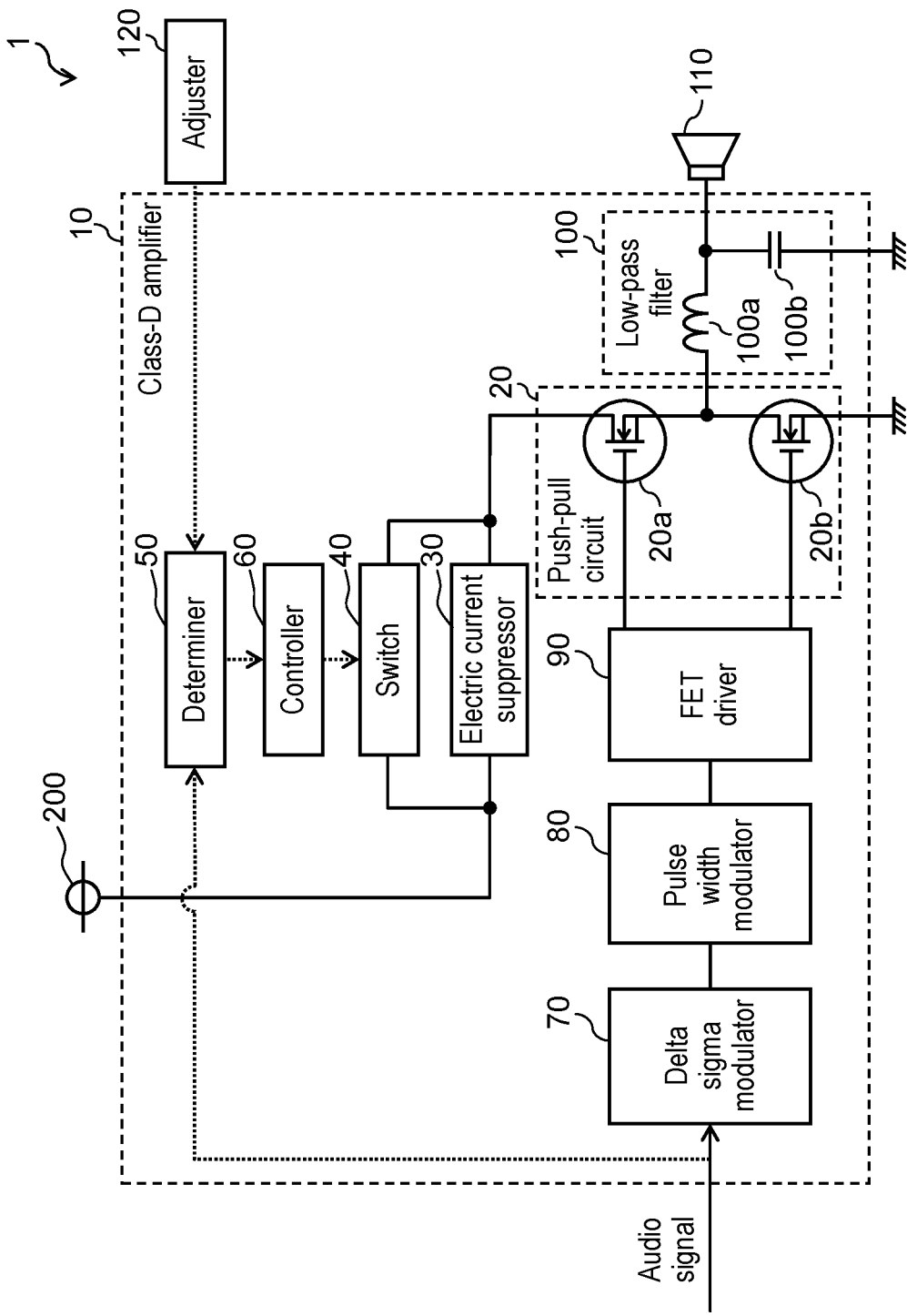
FIG. 1 is a block diagram schematically illustrating an example configuration of an audio playback apparatus according to a first exemplary embodiment.

FIG. 1 is a block diagram schematically illustrating an example configuration of audio playback apparatus 1 according to the first exemplary embodiment.

Audio playback apparatus 1 is an apparatus that emits sound according to an audio signal (digital audio signal) obtained through playing back an audio source stored in a compact disc (CD), a digital versatile disc (DVD), a Blu-ray (registered trademark) disc (BD), a hard disk drive (HDD), a memory card, or any other storage medium. Audio playback apparatus 1 includes class-D amplifier 10, loudspeaker 110, and adjuster 120. Audio playback apparatus 1 may include a device (not shown) for obtaining an audio signal from any of these storage media. FIG. 1 shows only a path for an incoming audio signal. Audio playback apparatus 1 may include a device for obtaining an audio signal from radio or television broadcasting, or may include a device for receiving an audio signal via a communication line. Audio playback apparatus 1 may be configured to receive an audio signal input from the outside of Audio playback apparatus 1. Audio playback apparatus 1 may include a device for converting an analog audio signal into a digital audio signal.

Loudspeaker 110 converts analog audio signal power output from class-D amplifier 10 into acoustical energy.

Adjuster 120 adjusts volume of sound emitted from loudspeaker 110. Adjuster 120 adjusts the volume of sound emitted from loudspeaker 110 according to a position set to a volume controller (not shown) included in audio playback apparatus 1, for example. When the volume controller is set to a position indicating the sound volume zero (mute), for example, adjuster 120 adjusts the volume of sound emitted from loudspeaker 110 to substantially zero such that no sound is emitted from loudspeaker 110. Adjuster 120 adjusts the volume of sound emitted from loudspeaker 110 in response to an action performed by a user via a remote control device (not shown, hereinafter abbreviated as a "remote controller") or any other device for remotely controlling audio playback apparatus 1, for example. When a user performs an action to set the sound volume to mute using a remote controller or another device, for example, adjuster 120 adjusts the volume of sound emitted from loudspeaker 110 to substantially zero such that no sound is emitted from loudspeaker 110. The substantially zero is not limited to a state of completely zero sound volume (silence). The substantially zero includes a state of substantially zero sound volume (substantially silence, e.g., a state of a sound level that is lower than or equal to a predetermined threshold value).

Class-D amplifier 10 is an amplifier that has a high-efficiency and low-loss and dissipates less heat. The class-D amplifier provides higher power conversion efficiency than an analog amplifier such as a class-AB amplifier. Class-D amplifier 10 amplifies a pulse width modulation (PWM) signal based on an input digital audio signal. The audio signal shown in FIG. 1 is a digital audio signal.

Class-D amplifier 10 includes push-pull circuit 20, electric current suppressor 30, switch 40, determiner 50, controller 60, delta sigma modulator 70, pulse width modulator 80, field effect transistor (FET) driver 90, and low-pass filter 100.

Push-pull circuit 20 is an amplifier circuit having at least two switching transistors (in this exemplary embodiment, switching transistor 20a and switching transistor 20b are illustrated as an example). Push-pull circuit 20 is a half-bridge circuit, for example. Switching transistors 20a and 20b are n-type metal-oxide-semiconductor field-effect transistors (MOSFETs), for example. Switching transistor 20a is turned on when a high (H) level of gate voltage Vga is applied to a gate of switching transistor 20a. When applied gate voltage Vga is at a low (L) level, switching transistor 20a is turned off. Similarly, switching transistor 20b is turned on when an H level of gate voltage Vgb is applied to a gate of switching transistor 20b. When applied gate voltage Vgb is at an L level, switching transistor 20b is turned off. One of switching transistors 20a and 20b may be an n-type MOSFET, and the other switching transistor may be a p-type MOSFET.

Rising and falling waveforms of gate voltage Vga, which is applied to the gate of switching transistor 20a, and gate voltage Vgb, which is applied to the gate of switching transistor 20b, are blunted by factors such as gate capacitance or resistive components. The rising waveform described herein is a voltage waveform presented when the gate voltage changes from the L level to the H level, whereas the falling waveform is a voltage waveform presented when the gate voltage changes from the H level to the L level. The bluntness of the voltage waveforms means a relatively slowing change in voltage when the gate voltage changes from the L level to the H level, or vice versa. Owing to the bluntness of the rising and falling waveforms of gate voltages Vga and Vgb, each of switching transistors 20a and 20b turns into a half-on state (a state between a conduction state and a non-conduction state) simultaneously, and shoot-through current flows through switching transistors 20a and 20b.

Figure 2:
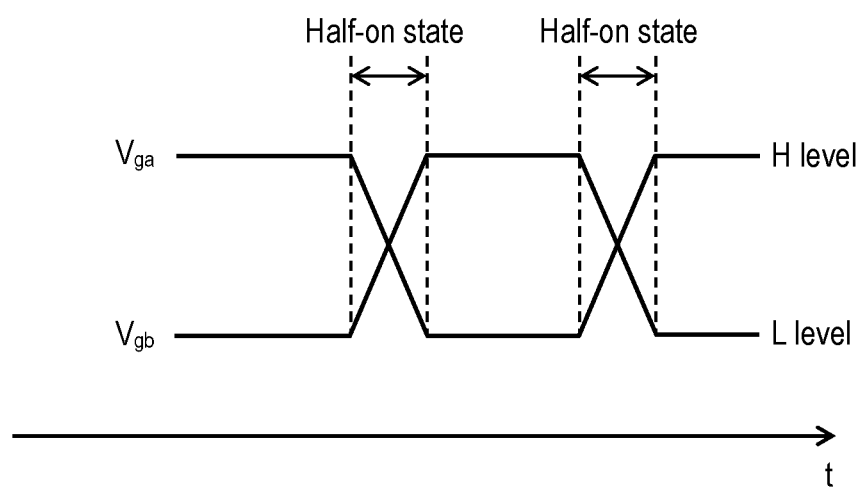
FIG. 2 is a drawing of waveforms schematically illustrating an example of changes in gate voltages when shoot-through current flows through switching transistors included in the audio playback apparatus according to the first exemplary embodiment.

FIG. 2 is a drawing of waveforms schematically illustrating an example of changes in gate voltages when shoot-through current flows through switching transistors 20a and 20b included in audio playback apparatus 1 according to the first exemplary embodiment.

When gate voltages Vga and Vgb cause switching transistors 20a and 20b to alternately switch between on and off (this action is hereinafter referred to as "switching"), it is ideal that gate voltages Vga and Vgb instantaneously shift between the H level and the L level. It is ideal that gate voltage Vgb be at the L level when gate voltage Vga is at the H level, and gate voltage Vgb be at the H level when gate voltage Vga is at the L level. However, as illustrated in FIG. 2, rising and falling waveforms of gate voltages Vga and Vgb are blunted during switching, and thus each of switching transistors 20a and 20b turns into a half-on state. As a result, shoot-through current flows through switching transistors 20a and 20b. This causes a deterioration in switching transistors 20a and 20b or an increase in the power consumption of class-D amplifier 10.

Figure 3:
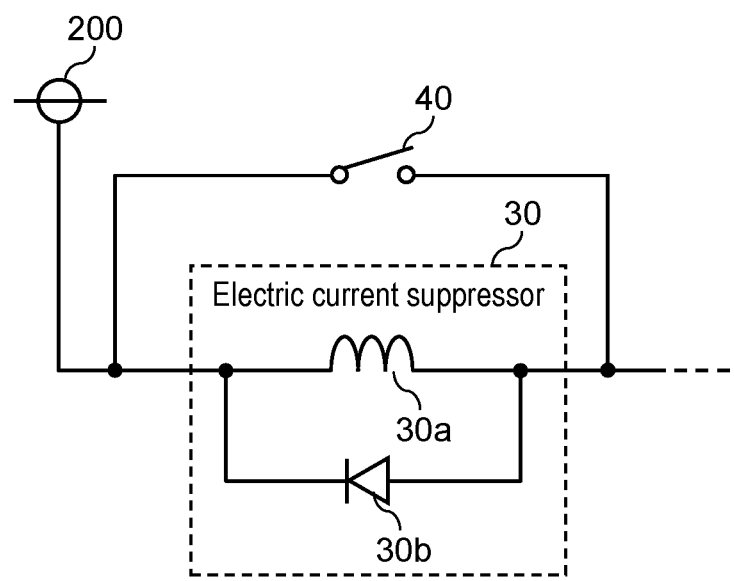
FIG. 3 is a circuit diagram illustrating an example configuration of an electric current suppressor included in the audio playback apparatus according to the first exemplary embodiment.

Electric current suppressor 30 is a circuit that suppresses the shoot-through current described above and is disposed between push-pull circuit 20 and power source 200 that supplies electric power to push-pull circuit 20. With reference to FIG. 3, a circuit configuration of electric current suppressor 30 will be described.

FIG. 3 is a circuit diagram illustrating an example configuration of electric current suppressor 30 included in audio playback apparatus 1 according to the first exemplary embodiment. FIG. 3 shows electric current suppressor 30, switch 40, and power source 200.

As shown in FIG. 3, electric current suppressor 30 is a circuit that includes, for example, inductor 30a. When a state in which no electric current flows through inductor 30a instantaneously shifts to a state in which electric current flows through inductor 30a, inductor 30a suppresses electric current flowing in response to the instantaneous shift. Specifically, when switch 40 switches from on to off and the path for electric current instantaneously shifts such that electric current that has not flowed through inductor 30a (e.g., electric current that has flowed through switch 40) starts to flow through inductor 30a, inductor 30a suppresses the electric current flowing in response to the instantaneous shift. This configuration suppresses electric current flowing into push-pull circuit 20 (shoot-through current) by shifting an electric current path running from power source 200 to push-pull circuit 20 from a path bypassing inductor 30a (e.g., a path running through switch 40) to a path running through inductor 30a when the shoot-through current described above is about to flow through push-pull circuit 20.

Electric current suppressor 30 is a circuit that further includes diode 30b connected in parallel with inductor 30a. Diode 30b has a cathode that is connected with power source 200 side of inductor 30a and an anode that is connected with push-pull circuit 20 side of inductor 30a. This configuration allows a large current owing to a counter electromotive force to flow into diode 30b. The counter electromotive force is generated when switch 40 switches from off to on and the path for electric current shifts from the path running through inductor 30a to the path bypassing inductor 30a (e.g., the path running through switch 40).

Switch 40 is a switch connected in parallel with electric current suppressor 30. Switch 40 is made up of at least one transistor or a relay circuit, for example. The path for electric current flowing from power source 200 to push-pull circuit 20 runs through electric current suppressor 30 when switch 40 turns to off, and shifts to the path bypassing electric current suppressor 30 (e.g., the path running through switch 40) when switch 40 turns to on. Switching between on and off of switch 40 is controlled by controller 60.

"The path for electric current flowing from power source 200 to push-pull circuit 20 runs through electric current suppressor 30" described above is not confined to meaning that all the electric current flowing from power source 200 to push-pull circuit 20 flows through electric current suppressor 30. This state also includes a state in which electric current primarily flows from power source 200 to push-pull circuit 20 through electric current suppressor 30 and relatively tiny electric current flows from power source 200 to push-pull circuit 20 through a path excluding electric current suppressor 30. "The path for electric current flowing from power source 200 to push-pull circuit 20 bypasses electric current suppressor 30" described above is not confined to meaning that all the electric current flowing from power source 200 to push-pull circuit 20 bypasses electric current suppressor 30 (e.g., flows through switch 40). This state also includes a state in which electric current primarily flows from power source 200 to push-pull circuit 20 by bypassing electric current suppressor 30 (e.g., flowing through switch 40) and relatively tiny electric current flows from power source 200 to push-pull circuit 20 through electric current suppressor 30.

Determiner 50 determines whether or not class-D amplifier 10 (or audio playback apparatus 1) is in a state where sound is not emitted from loudspeaker 110. An operation performed by determiner 50 will be described later with reference to FIG. 4.

Controller 60 turns off switch 40 when determiner 50 determines that class-D amplifier 10 (or audio playback apparatus 1) is in a state where sound is not emitted from loudspeaker 110. Controller 60 turns on switch 40 when determiner 50 determines that class-D amplifier 10 (or audio playback apparatus 1) is in a state where sound is emitted from loudspeaker 110. An operation performed by controller 60 will be described later with reference to FIG. 4.

In response to a signal sent from adjuster 120 or a digital signal processor for processing an audio signal (DSP, not shown), determiner 50 determines whether or not class-D amplifier 10 (or audio playback apparatus 1) is in a state where sound is not emitted from loudspeaker 110. Controller 60 outputs a signal to control switch 40 to switch between on and off in response to a result of determination made by determiner 50. Determiner 50 and controller 60 may be implemented by a microprocessor and a computer program (software), for example, or may be implemented by dedicated circuits. Determiner 50 and controller 60 may be implemented by devices such as a level comparator or a voltage detection circuit, for example.

Delta sigma modulator 70 restricts a dynamic range for an input audio signal (a dynamic range determined by the number of quantization of an input digital audio signal) to an audible frequency range of up to 20 kHz, for example and thereby makes the number of quantization of an output audio signal smaller than the input audio signal. Specifically, delta sigma modulator 70 is configured with including an oversampling filter and a noise shaper. The oversampling filter first converts a sampling frequency for an input audio signal to a power of two (oversampling) and removes an aliasing component from the input audio signal. Next, the noise shaper re-quantizes an oversampled audio signal with the number of quantization that is smaller than the input audio signal. The noise shaper reduces re-quantization noise generated in the re-quantizing process at an audible frequency range of 20 kHz and lower, for example.

Pulse width modulator 80 converts a signal output from delta sigma modulator 70 into a PWM signal. This PWM signal is a signal generated after conversion of a gradation of an amplitude level (i.e., an amplitude size) of a signal input into pulse width modulator 80 to a gradation of a pulse width level.

FET driver 90 has a first circuit (not shown) that outputs a signal based on the PWM signal sent from pulse width modulator 80 to the gate of switching transistor 20a and a second circuit (not shown) that outputs a signal based on the PWM signal to the gate of switching transistor 20b.

The first circuit includes an AND gate with two inputs and one output (not shown). One of the two input terminals of the AND gate included in the first circuit is connected with an output terminal of pulse width modulator 80, whereas the other input terminal of the AND gate is connected with the output terminal of pulse width modulator 80 via an RC circuit (not shown). The output terminal of the AND gate is connected with the gate of switching transistor 20a. In other words, the first circuit calculates a logical product of the PWM signal sent from pulse width modulator 80 and a signal generated by delaying the PWM signal sent from pulse width modulator 80 by a desired dead time length caused by the RC circuit. Then, the first circuit outputs a signal representing a result of the calculation to the gate of switching transistor 20a. This signal output from the first circuit is gate voltage Vga.

The second circuit includes an inverter (not shown) and an AND gate with two inputs and one output (not shown). An input terminal of the inverter is connected with the output terminal of pulse width modulator 80. One of the two input terminals of the AND gate included in the second circuit is connected with an output terminal of the inverter, whereas the other input terminal of the AND gate is connected with the output terminal of the inverter via an RC circuit (not shown). The output terminal of the AND gate is connected with the gate of switching transistor 20b. In other words, the second circuit calculates a logical product of an inverse signal of the PWM signal sent from pulse width modulator 80 and a signal generated by delaying the inverse signal of the PWM signal sent from pulse width modulator 80 by a desired dead time length caused by the RC circuit. Then, the second circuit outputs a signal representing a result of the calculation to the gate of switching transistor 20b. This signal output from the second circuit is gate voltage Vgb.

This configuration enables push-pull circuit 20 to amplify a PWM signal sent from pulse width modulator 80.

In FET driver 90 having the configuration described above, the dead time can be set to a desired length by adjusting values of resistors and capacitors included in the respective RC circuits.

Low-pass filter 100 is a filter that demodulates a signal amplified at push-pull circuit 20 to an analog audio signal. Low-pass filter 100 is configured with including inductor 100a and capacitor 100b in order to reduce electric power loss.

[1-2. Operation]

An operation of audio playback apparatus 1 configured as described above will be described.

Figure 4:
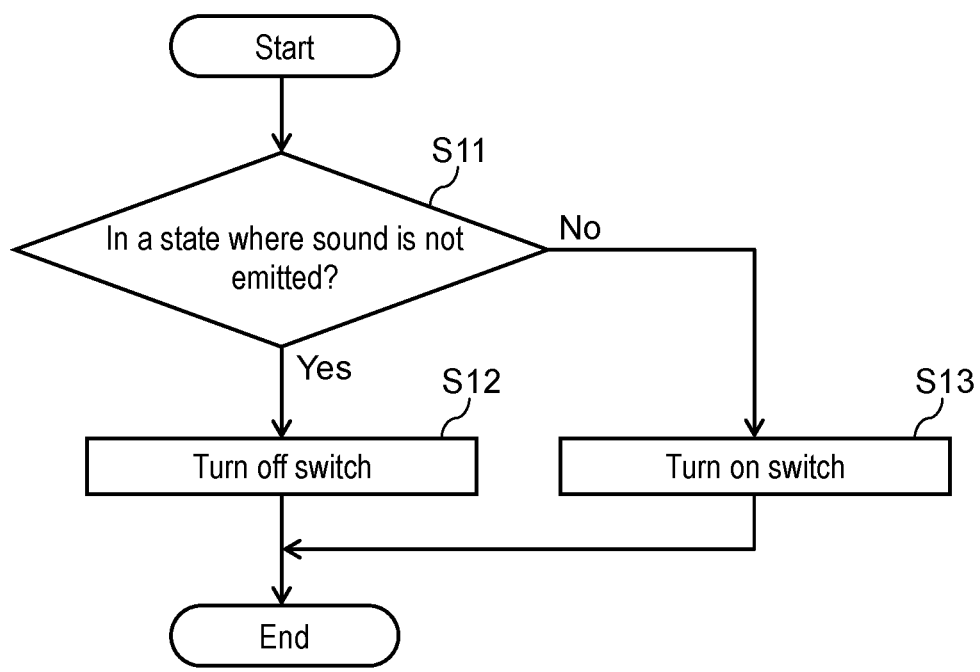
FIG. 4 is a flowchart illustrating an example operation performed by a class-D amplifier included in the audio playback apparatus according to the first exemplary embodiment.

FIG. 4 is a flowchart illustrating an example operation performed by class-D amplifier 10 included in audio playback apparatus 1 according to the first exemplary embodiment.

Determiner 50 determines whether or not class-D amplifier 10 (or audio playback apparatus 1) is in a state where sound is not emitted from loudspeaker 110 (step S11).

States in which sound is not emitted from loudspeaker 110 include at least one of a state in which no audio signal is input into class-D amplifier 10, a state in which a level of an audio signal input into class-D amplifier 10 is substantially zero, and a state in which the volume of sound emitted from loudspeaker 110 connected to class-D amplifier 10 is adjusted to substantially zero by adjuster 120, for example. Meanwhile, states in which sound is emitted from loudspeaker 110 include a state in which an audio signal is input into class-D amplifier 10, a level of the audio signal input into class-D amplifier 10 is not substantially zero, and the volume of sound emitted from loudspeaker 110 connected to class-D amplifier 10 is adjusted to larger than the substantially zero by adjuster 120, for example. In order to determine which state the class-D amplifier is in, determiner 50 determines whether or not an audio signal is input into class-D amplifier 10, for example. Determiner 50 determines whether a level of the audio signal input into class-D amplifier 10 is substantially zero or not, for example. Determiner 50 determines whether or not the volume of sound emitted from loudspeaker 110 connected to class-D amplifier 10 is adjusted to substantially zero by adjuster 120, for example.

When determiner 50 determines that class-D amplifier 10 (or audio playback apparatus 1) is in a state where sound is not emitted from loudspeaker 110 in step S11 (Yes in step S11), controller 60 turns off switch 40 (step S12).

As a consequence, the path for electric current flowing from power source 200 to push-pull circuit 20 runs through electric current suppressor 30. In other words, when class-D amplifier 10 (or audio playback apparatus 1) is in a state where sound is not emitted from loudspeaker 110, in class-D amplifier 10, electric current flowing into push-pull circuit 20 (i.e., shoot-through current) is suppressed in electric current suppressor 30.

When determiner 50 determines that class-D amplifier 10 (or audio playback apparatus 1) is in a state where sound is emitted from loudspeaker 110 in step S11 (No in step S11), controller 60 turns on switch 40 (step S13).

As a consequence, the path for electric current flowing from power source 200 to push-pull circuit 20 bypasses electric current suppressor 30 (e.g., the path running through switch 40). In other words, when class-D amplifier 10 (or audio playback apparatus 1) is in a state where sound is emitted from loudspeaker 110, in class-D amplifier 10, electric current flowing into push-pull circuit 20 is not suppressed in electric current suppressor 30.

In class-D amplifier 10 according to this exemplary embodiment as described above, shoot-through current flowing through push-pull circuit 20 is suppressed in electric current suppressor 30 when class-D amplifier 10 (or audio playback apparatus 1) is in a state where sound is not emitted from loudspeaker 110. In other words, electric current suppressor 30 suppresses shoot-through current flowing through push-pull circuit 20 when class-D amplifier 10 is in a state where playback of an audio source stored in a CD, a DVD, a BD, an HDD, a memory card, or any other storage medium is completed, an audio source being played back is put in a silent period, the volume controller included in audio playback apparatus 1 is set to a position indicating the sound volume zero (mute) by a user, or the sound volume is set to mute by a user using a remote controller or any other device for remotely controlling audio playback apparatus 1, for example. Meanwhile, in class-D amplifier 10, electric power is supplied from power source 200 to push-pull circuit 20 without being influenced by electric current suppressor 30 (i.e., electric current is not suppressed by electric current suppressor 30) when class-D amplifier 10 (or audio playback apparatus 1) is in a state where sound is emitted from loudspeaker 110, that is to say, class-D amplifier 10 is in a state where an audio signal is input into class-D amplifier 10, the level of the audio signal input into class-D amplifier 10 is not substantially zero, and the volume of sound emitted from loudspeaker 110 is larger than substantially zero, for example.

[1-3. Effects and Others]

As described above, in this exemplary embodiment, the class-D amplifier is a class-D amplifier that amplifies an input audio signal. The class-D amplifier includes: a push-pull circuit that has at least two switching transistors; an electric current suppressor that is disposed between the push-pull circuit and a power source that supplies electric power to the push-pull circuit; a switch that is connected in parallel with the electric current suppressor; a determiner that determines whether or not the class-D amplifier is in a state where sound is not emitted; and a controller. When the determiner determines that the class-D amplifier is in a state where sound is not emitted, the controller turns off the switch such that a path for electric current flowing from the power source to the push-pull circuit runs through the electric current suppressor. When the determiner determines that the class-D amplifier is in a state where sound is emitted, the controller turns on the switch such that the path for electric current bypasses the electric current suppressor.

Class-D amplifier 10 is an example of the class-D amplifier. Switching transistors 20a and 20b are an example of the at least two switching transistors. Push-pull circuit 20 is an example of the push-pull circuit. Power source 200 is an example of the power source. Electric current suppressor 30 is an example of the electric current suppressor. Switch 40 is an example of the switch. Determiner 50 is an example of the determiner. Controller 60 is an example of the controller.

In the first exemplary embodiment as an example, for example, class-D amplifier 10 includes: push-pull circuit 20 that has switching transistors 20a and 20b; electric current suppressor 30 that is disposed between push-pull circuit 20 and power source 200 that supplies electric power to push-pull circuit 20; switch 40 that is connected in parallel with electric current suppressor 30; determiner 50 that determines whether or not class-D amplifier 10 is in a state where sound is not emitted; and controller 60. When determiner 50 determines that class-D amplifier 10 is in a state where sound is not emitted, controller 60 turns off switch 40 such that a path for electric current flowing from power source 200 to push-pull circuit 20 runs through electric current suppressor 30. When determiner 50 determines that class-D amplifier 10 is in a state where sound is emitted, controller 60 turns on switch 40 such that the path for electric current bypasses electric current suppressor 30.

In class-D amplifier 10 configured as described above, the path for electric current flowing from power source 200 to push-pull circuit 20 is the path running through electric current suppressor 30 for suppressing electric current when class-D amplifier 10 is in a state where sound is not emitted from a sound emitting device such as loudspeaker 110 connected to class-D amplifier 10. Thus, class-D amplifier 10 suppresses shoot-through current flowing through push-pull circuit 20. When class-D amplifier 10 that is in a state where sound is not emitted from the sound emitting device such as loudspeaker 110 turns into in a state where sound is emitted from the sound emitting device, switch 40 such as a transistor or a relay circuit instantaneously turns to on such that the path for electric current flowing from power source 200 to push-pull circuit 20 instantly bypasses electric current suppressor 30 (e.g., the path running through switch 40) in class-D amplifier 10. Consequently, in class-D amplifier 10, when class-D amplifier 10 is in a state where sound is emitted from the sound emitting device such as loudspeaker 110, electric current suppressor 30 in class-D amplifier 10 has no impact on electric current flowing into push-pull circuit 20. Thus, class-D amplifier 10 reduces sound quality deterioration. In this configuration, class-D amplifier 10 that includes electric current suppressor 30 suppresses shoot-through current at the time of no sound being emitted from the sound emitting device such as loudspeaker 110 connected to class-D amplifier 10 while reducing sound quality deterioration. As a result, class-D amplifier 10 reduces sound quality deterioration, and suppresses deterioration of switching transistors 20a and 20b. This configuration is beneficial to class-D amplifiers that are required to offer long life and high sound quality.

In the class-D amplifier, the electric current suppressor may be a circuit that includes an inductor.

Inductor 30a is an example of the inductor.

For example, in the example described in the first exemplary embodiment, electric current suppressor 30 in class-D amplifier 10 is a circuit that includes inductor 30a.

Electric power loss is less likely to occur at inductor 30a. This configuration enables class-D amplifier 10 to lower power consumption.

In the class-D amplifier, the electric current suppressor may be a circuit that further includes a diode connected in parallel with the inductor.

Diode 30b is an example of the diode.

For example, in the example described in the first exemplary embodiment, electric current suppressor 30 in class-D amplifier 10 is a circuit that further includes diode 30b connected in parallel with inductor 30a.

This configuration enables class-D amplifier 10 to suppress the effect due to a counter electromotive force generated at inductor 30a. A counter electromotive force is generated at inductor 30a when switch 40 switches from off to on. Owing to the counter electromotive force, class-D amplifier 10 suppresses an overcurrent flowing through switching transistors 20a and 20b, for example.

In the class-D amplifier, states in which sound is not emitted may include at least one of a state in which no audio signal is input into the class-D amplifier and a state in which a level of the audio signal input into the class-D amplifier is substantially zero.

For example, in the example described in the first exemplary embodiment, in class-D amplifier 10, states in which sound is not emitted include at least one of a state in which no audio signal is input into class-D amplifier 10 and a state in which a level of the audio signal input into class-D amplifier 10 is substantially zero.

Accordingly, class-D amplifier 10 suppresses shoot-through current flowing through push-pull circuit 20 when class-D amplifier 10 is in a state where playback of an audio source is completed, i.e., it is an example of the state in which no audio signal is input into class-D amplifier 10. Class-D amplifier 10 suppresses shoot-through current flowing through push-pull circuit 20 when class-D amplifier 10 is in a state where an audio source being played back is put in a silent period, i.e., it is an example of the state in which a level of the audio signal input into class-D amplifier 10 is substantially zero.

In this exemplary embodiment, an audio playback apparatus includes the class-D amplifier according to the present disclosure, a loudspeaker that converts an amplified signal output from the class-D amplifier to sound, and an adjuster that adjusts volume of sound emitted from the loudspeaker. In the audio playback apparatus, states in which sound is not emitted include a state in which the volume of sound is adjusted to substantially zero by the adjuster.

Audio playback apparatus 1 is an example of the audio playback apparatus. Class-D amplifier 10 is an example of the class-D amplifier. Loudspeaker 110 is an example of the loudspeaker. Adjuster 120 is an example of the adjuster.

For example, in the example described in the first exemplary embodiment, audio playback apparatus 1 includes class-D amplifier 10, loudspeaker 110 that converts an amplified signal output from class-D amplifier 10 to sound, and adjuster 120 that adjusts the volume of sound emitted from loudspeaker 110. In audio playback apparatus 1, states in which sound is not emitted include a state in which the volume of sound emitted from loudspeaker 110 is adjusted to substantially zero by adjuster 120.

In audio playback apparatus 1 configured as described above, the path for electric current flowing from power source 200 to push-pull circuit 20 is the path running through electric current suppressor 30 for suppressing electric current when class-D amplifier 10 (or audio playback apparatus 1) is in a state where sound is not emitted from loudspeaker 110. Thus, audio playback apparatus 1 suppresses shoot-through current flowing through push-pull circuit 20. When class-D amplifier 10 (or audio playback apparatus 1) that is in a state where sound is not emitted from loudspeaker 100 turns into in a state where sound is emitted from loudspeaker 110, switch 40 such as a transistor or a relay circuit instantaneously turns to on such that the path for electric current flowing from power source 200 to push-pull circuit 20 instantly bypasses electric current suppressor 30 (e.g., the path running through switch 40) in audio playback apparatus 1. Consequently, while class-D amplifier 10 (or audio playback apparatus 1) is in a state where sound is emitted from loudspeaker 110, electric current suppressor 30 in audio playback apparatus 1 has no impact on electric current flowing into push-pull circuit 20. Thus, audio playback apparatus 1 reduces sound quality deterioration. In this configuration, audio playback apparatus 1 that includes electric current suppressor 30 suppresses shoot-through current at the time of no sound being emitted from loudspeaker 110 while reducing sound quality deterioration. As a result, audio playback apparatus 1 reduces sound quality deterioration, and suppresses deterioration of switching transistors 20a and 20b. This configuration is beneficial to audio playback apparatuses incorporating class-D amplifiers that are required to offer long life and high sound quality.

Audio playback apparatus 1 suppresses shoot-through current flowing through push-pull circuit 20 when the apparatus is in a state where the volume of sound emitted from loudspeaker 110 is adjusted to substantially zero by adjuster 120. States in which the volume of sound emitted from loudspeaker 110 is adjusted to substantially zero by adjuster 120 include at least one of a state in which the volume controller included in audio playback apparatus 1 is set to a position indicating the sound volume zero (mute) by a user, and a state in which the sound volume is set to mute by a user using a remote controller or any other device for remotely controlling audio playback apparatus 1, for example.

Other Exemplary Embodiments

The first exemplary embodiment has been described above as an example of the technique disclosed in the present disclosure. The technique according to the present disclosure, however, can be applied to any exemplary embodiment to which modification, replacement, addition, omission, or the like are made, other than the first exemplary embodiment. In addition, new exemplary embodiments can be made by combining constituents described in the above first exemplary embodiment.

Accordingly, other exemplary embodiments as below will be described.

In the first exemplary embodiment, electric current suppressor 30 that includes inductor 30a is described as an example of the electric current suppressor. However, the electric current suppressor may be any circuit that suppresses shoot-through current, other than a circuit that includes an inductor. The electric current suppressor may be a circuit that includes a resistor, for example. In this case, the resistor causes electric power loss. Thus, it is preferred that the electric current suppressor be a circuit that includes the inductor.

In the first exemplary embodiment, push-pull circuit 20 is described as a half-bridge circuit to show an example of the push-pull circuit. However, it should not be construed that the push-pull circuit is limited to the half bridge circuit. The push-pull circuit may be any circuit that performs push-pull operation, other than half-bridge circuits. The push-pull circuit may be a full-bridge circuit, for example. The push-pull circuit in this case has a complicated circuit configuration although the full-bridge circuit provides higher power conversion efficiency than the half-bridge circuit.

In the first exemplary embodiment, MOSFETs are described as an example of switching transistors 20a and 20b included in push-pull circuit 20. However, this example should not be construed to limit the scope of the present disclosure. Switching transistors 20a and 20b may be bipolar transistors or bipolar complementary metal oxide semiconductor (BiCMOS) transistors, for example.

In the configuration example shown in the first exemplary embodiment, switch 40 connected in parallel with electric current suppressor 30 switches between on and off such that the path for electric current flowing to push-pull circuit 20 shifts between the path running through switch 40 instead of electric current suppressor 30 and the path running through electric current suppressor 30 instead of switch 40. However, this configuration example should not be construed to limit the scope of the present disclosure. The class-D amplifier may have any configuration that the path for electric current flowing to the push-pull circuit can shift between a path running through the electric current suppressor and a path bypassing the electric current suppressor. For example, the class-D amplifier may have a low-resistance conductive line that allows electric current to flow to the push-pull circuit by bypassing the electric current suppressor. And, the class-D amplifier may have a configuration in which the switch shifts the path for electric current flowing to the push-pull circuit between a path running through the electric current suppressor and a path running through the conductive line bypassing the electric current suppressor.

The present disclosure can implement as a class-D amplifier, and also implement as a method involving steps (processes) performed by a determiner and a controller included in the class-D amplifier.

These steps may be performed by a computer (a computer system), for example. The present disclosure also may be implemented as a computer program that causes a computer to perform the steps involved in the method. Also, the present disclosure may be implemented as a non-transitory computer-readable recording media such as a compact disc read-only memory (CD-ROM) storing the computer program.

For example, in a case where the present disclosure is achieved by a computer program (software), respective steps are executed by executing the program through the use of hardware resources such as a central processing unit (CPU), a memory, and input-output circuits on the computer. In other words, the computer performs the respective steps by letting the CPU acquire data from the memory, the input-output circuits, or other units, carry out computations, and output computation results to the memory, the input-output circuits, or the other units.

The determiner and the controller included in the class-D amplifier according to the present disclosure may be implemented using a large-scale integration (LSI) that is one of integrated circuits (ICs).

The integrated circuit is not limited to the LSI. The integrated circuit also may be implemented using a dedicated circuit or a general purpose processor. A field-programmable gate array (FPGA) or a reconfigurable processor that allows reconfiguration of circuit cell connections and settings inside an LSI may be used.

If the progress of semiconductor technology or other derivative technologies result in the emergence of a circuit integration technology that replaces LSI, circuit integration on the determiner and the controller included in a class-D amplifier may be implemented using the new technology.

As described above, the exemplary embodiments have been described to exemplify the technique disclosed in the present disclosure. For that purpose, the accompanying drawings and detailed description are provided.

Consequently, the accompanying drawings and the detailed description above may include not only components essential for solving the problem but also components that are not essential for solving the problem. For this reason, those nonessential components that are illustrated in the accompanying drawings or described in the detailed description should not be construed as essential.

Further, since the above exemplary embodiments illustrate the technique in the present disclosure, various modifications, substitutions, additions and omissions can be performed within the scope of claims and equivalent scope of claims.

INDUSTRIAL APPLICABILITY

The present disclosure is applicable to class-D amplifiers. Specifically, the present disclosure is applicable to audio playback apparatuses such as an audio apparatus, a television set, a personal computer (PC), a portable device, and the like.

REFERENCE MARKS IN THE DRAWINGS 1 audio playback apparatus
10 class-D amplifier
20 push-pull circuit
20a, 20b switching transistor
30 electric current suppressor
30a, 100a inductor
30b diode
40 switch
50 determiner
60 controller
70 delta sigma modulator
80 pulse width modulator
90 FET driver
100 low-pass filter
100b capacitor
110 loudspeaker
120 adjuster
200 power source

The invention claimed is:

1. A class-D amplifier that amplifies an input audio signal, the class-D amplifier comprising:
    a push-pull circuit that has at least two switching transistors;
    an electric current suppressor that is disposed between the push-pull circuit and a power source that supplies electric power to the push-pull circuit;
    a switch that is connected in parallel with the electric current suppressor;
    a determiner that determines whether or not the class-D amplifier is in a state where sound is not emitted; and
    a controller,
    wherein the controller, when the determiner determines that the class-D amplifier is in a state where sound is not emitted, turns off the switch such that a path for electric current flowing from the power source to the push-pull circuit runs through the electric current suppressor, and
    the controller, when the determiner determines that the class-D amplifier is in a state where sound is emitted, turns on the switch such that the path for electric current bypasses the electric current suppressor.

2. The class-D amplifier according to claim 1, wherein the electric current suppressor is a circuit that includes an inductor.

3. The class-D amplifier according to claim 2, wherein the electric current suppressor is a circuit that further includes a diode connected in parallel with the inductor.

4. The class-D amplifier according to claim 1, wherein states in which the sound is not emitted include at least one of a state in which none of the audio signal is input into the class-D amplifier and a state in which a level of the audio signal input into the class-D amplifier is substantially zero.

5. An audio playback apparatus comprising:
    the class-D amplifier according to claim 1;
    a loudspeaker that converts an amplified signal output from the class-D amplifier to sound; and
    an adjuster that adjusts volume of sound emitted from the loudspeaker,
    wherein states in which sound is not emitted include a state in which the volume of sound is adjusted to substantially zero by the adjuster.

* * * * *